United States Patent
Yang et al.

(10) Patent No.: US 12,394,684 B2
(45) Date of Patent: Aug. 19, 2025

(54) DIE STACKING STRUCTURE, SEMICONDUCTOR PACKAGE AND FORMATION METHOD OF THE DIE STACKING STRUCTURE

(71) Applicant: Taiwan Semiconductor Manufacturing Company, Ltd., Hsinchu (TW)

(72) Inventors: Su-Chun Yang, Hsinchu County (TW); Jih-Churng Twu, Hsinchu County (TW); Jiung Wu, Taoyuan (TW); Chih-Hang Tung, Hsinchu (TW); Chen-Hua Yu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 536 days.

(21) Appl. No.: 17/744,737

(22) Filed: May 16, 2022

(65) Prior Publication Data

US 2023/0369156 A1 Nov. 16, 2023

(51) Int. Cl.
*H01L 23/31* (2006.01)
*H01L 21/56* (2006.01)
(Continued)

(52) U.S. Cl.
CPC ........ *H01L 23/3192* (2013.01); *H01L 21/561* (2013.01); *H01L 23/291* (2013.01); *H01L 23/293* (2013.01); *H01L 23/3185* (2013.01); *H01L 23/49816* (2013.01); *H01L 23/49833* (2013.01); *H01L 24/08* (2013.01); *H01L 24/80* (2013.01); *H01L 25/105* (2013.01); *H01L 23/3142* (2013.01); *H01L 23/49822* (2013.01); *H01L 23/49838* (2013.01); *H01L 24/16* (2013.01); *H01L 24/32* (2013.01); *H01L 24/48* (2013.01); *H01L 24/73* (2013.01);
(Continued)

(58) Field of Classification Search
CPC ........... H01L 21/561; H01L 21/56–568; H01L 23/291; H01L 23/293; H01L 23/3185; H01L 23/49816; H01L 23/49833; H01L 23/3142; H01L 23/49822; H01L 23/49838; H01L 23/28–3192; H01L 24/08; H01L 24/80; H01L 24/16; H01L 24/32; H01L 24/48; H01L 24/73; H01L 25/105; H01L 2924/181–186
See application file for complete search history.

(56) References Cited

U.S. PATENT DOCUMENTS 8,993,380 B2    3/2015  Hou et al.
9,281,254 B2    3/2016  Yu et al.
(Continued)

*Primary Examiner* — Steven B Gauthier
*Assistant Examiner* — Rhys Poniente Sheker
(74) *Attorney, Agent, or Firm* — JCIPRNET

(57) ABSTRACT

A die stacking structure, a semiconductor package and a method for forming the die stacking structure are provided. The die stacking structure includes a first device die; second device dies, bonded onto the first device die, and arranged side-by-side; and a stack of dielectric layers, extending in between the second device dies, and laterally enclosing each of the second device dies. The dielectric layers are respectively formed of a spin-on-glass (SOG) or a polymer, and a lower one of the dielectric layers has a thickness greater than a thickness of another one of the dielectric layers at a higher level.

20 Claims, 16 Drawing Sheets

(51) Int. Cl.
*H01L 23/00* (2006.01)
*H01L 23/29* (2006.01)
*H01L 23/498* (2006.01)
*H01L 25/10* (2006.01)

(52) U.S. Cl.
CPC ............ *H01L 2224/08148* (2013.01); *H01L 2224/16227* (2013.01); *H01L 2224/16237* (2013.01); *H01L 2224/32225* (2013.01); *H01L 2224/48228* (2013.01); *H01L 2224/73204* (2013.01); *H01L 2224/80895* (2013.01); *H01L 2224/80896* (2013.01); *H01L 2225/1023* (2013.01); *H01L 2225/1058* (2013.01)

(56) References Cited

U.S. PATENT DOCUMENTS

| | | |
|---|---|---|
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 2020/0006181 A1* | 1/2020 | Chen ................. H01L 25/105 |
| 2021/0066155 A1* | 3/2021 | Nofen ................ H01L 21/565 |
| 2021/0343660 A1* | 11/2021 | Lee .................... H01L 24/29 |
| 2024/0194708 A1* | 6/2024 | Adachi ............... H01L 23/367 |

\* cited by examiner

ND formation METHOD OF THE DIE STACKING STRUCTURE

DIE STACKING STRUCTURE, SEMICONDUCTOR PACKAGE AND FORMATION METHOD OF THE DIE STACKING STRUCTURE

BACKGROUND

In recent years, semiconductor industry has strived to continually reduce feature size and power consumption of various electronic components, while on the other hand increasing device density, wire density and operation frequency of the electronic components. These advanced electronic components also require smaller packages that utilize less area than packages of the past.

Three dimensional integrated circuit (3DIC) is a recent development in semiconductor packaging in which multiple semiconductor dies are stacked upon one another. 3DIC provides improved integration density and other advantages, such as greater operation speed and higher bandwidth, because of the decreased length of interconnects between the stacked dies. However, there are quite a few challenges to be overcome for the technology of 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
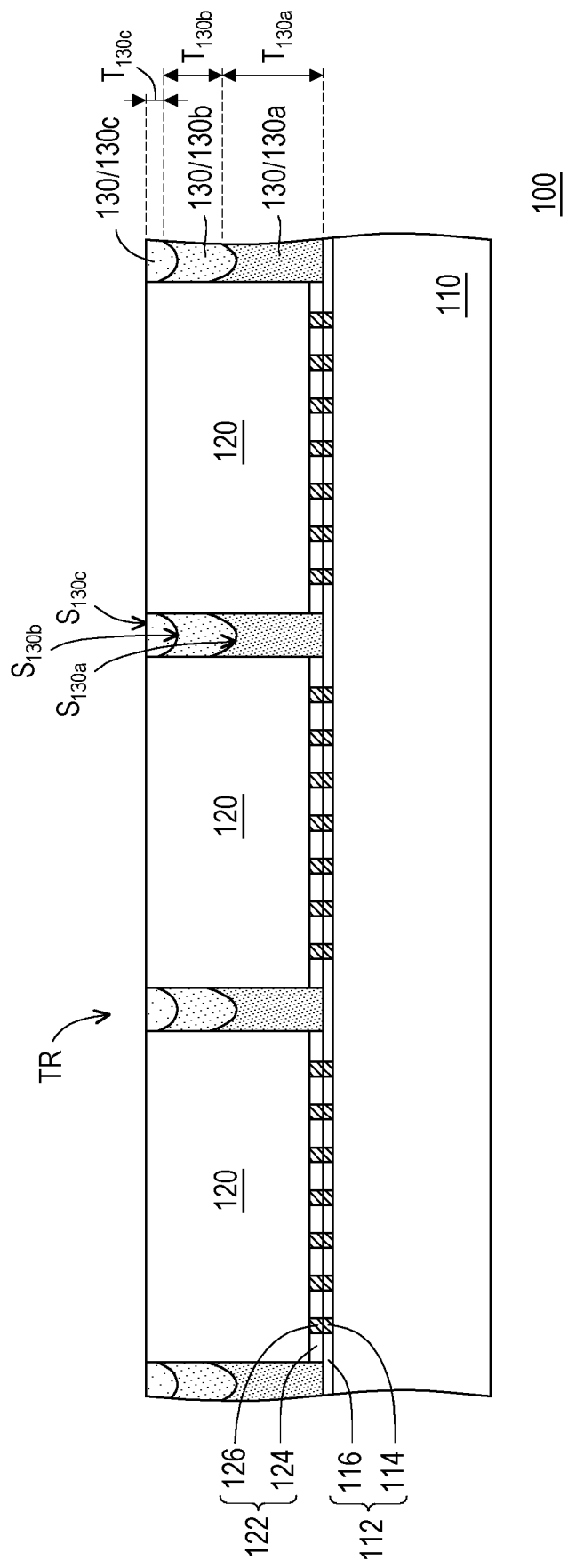
FIG. 1 is a schematic cross-sectional view illustrating a package structure, according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be appreciated that the following embodiment(s) of the present disclosure provides applicable concepts that can be embodied in a wide variety of specific contexts. The embodiments are intended to provide further explanations but are not used to limit the scope of the present disclosure.

FIG. 1 is a schematic cross-sectional view illustrating a package structure 100, according to some embodiments of the present disclosure.

Referring to FIG. 1, the package structure 100 includes a device wafer 110 and multiple device dies 120 bonded to the device wafer 110. Although not shown, the device wafer 110 may include active devices built on a semiconductor substrate, and may include a stack of metallization layers over the semiconductor substrate for out routing and interconnecting the active devices. A side of the semiconductor substrate at which the active devices and the metallization layers are formed is herein referred to as a front side of the device wafer 110. On the other hand, the other side of the semiconductor substrate facing away from the active devices and the metallization layers is herein referred to as a back side of the device wafer 110. According to some embodiments, the device dies 120 are bonded to the front side of the device wafer 110. In alternative embodiments, the device dies 120 are bonded to the back side of the device wafer 110.

In some embodiments, the device wafer 110 includes a bonding layer 112 on which the device dies 120 are bonded. In those embodiments where the device dies 120 are bonded to the front side of the device wafer 110, the bonding layer 112 is disposed at the front side of the device wafer 110. On the other hand, in those embodiments where the device dies 120 are bonded to the back side of the device wafer 110, the bonding layer 112 is disposed at the back side of the device wafer 110. The device wafer 110 can be physically and electrically contacted with the device dies 120 through the bonding layer 112. According to some embodiments, the bonding layer 112 includes conductive pads 114 and an insulating layer 116 laterally surrounding the conductive pads 114. In those embodiments where the device dies 120 are bonded to the back side of the device wafer 110, the device wafer 110 may further include through substrate vias (not shown). The through substrate vias extend into the device wafer 110 from a back surface of the semiconductor substrate of the device wafer 110, to be electrically connected with the active devices and the metallization layers formed at the front side of the device wafer 110. In other words, the through substrate vias provide conduction paths connecting the front side of the device wafer 110 to the back side of the device wafer 110.

The device dies 120 may be singulated from other device wafer(s), and may be identical with or different from one another, in terms of size and types of the integrated circuits formed therein. As similar to the device wafer 110, each device die 120 may include active devices built on a semiconductor substrate, and may include a stack of metallization layers formed over the semiconductor substrate. A side of the semiconductor substrate at which the active devices and the metallization layers are formed is herein referred to as a front side of the device die 120. On the other hand, the other side of the semiconductor substrate facing away from the active devices and the metallization layers is herein referred to as a back side of the device die 120. According to some embodiments, each device die 120 is bonded to the device wafer 110 by its front side. In alternative embodiments, each device die 120 is bonded to the device wafer 110 by its back side.

Further, as similar to the device wafer 110, each device die 120 may include a bonding layer 122 configured to engage with the device wafer 110. In those embodiments where the device dies 120 are bonded to the device wafer 110 by their front sides, the bonding layers 122 are respectively disposed at the front side of one of the device dies 120. On the other hand, in those embodiments where the device dies 120 are bonded to the device wafer 110 by their back sides, the bonding layers 122 are respectively disposed at the back side of one of the device dies 120. The device dies 120 can be physically and electrically contacted with the device wafer 110 through the bonding layer 122. According to some embodiments, the bonding layer 122 includes conductive pads 124 and an insulating layer 126 laterally surrounding the conductive pads 124. Moreover, in those embodiments where the device dies 120 are bonded to the device wafer 110 by their back sides, each of the device dies 120 may further include through substrate vias (not shown). The through substrate vias extend into the device die 120 from a back surface of the semiconductor substrate of the device die 120, to be electrically connected with the active devices and the metallization layers formed at the front side of the device die 120. In other words, the through substrate vias in each device die 120 can provide conduction paths bridging between the front and back sides of the device die 120.

In some embodiments, the device dies 120 are bonded to the device wafer 110 by a hybrid bonding manner. In these embodiments, the conductive pads 124 in the bonding layers 122 of the device dies 120 are respectively bonded to one of the conductive pads 114 in the bonding layer 112 of the device wafer 110. In addition, the insulating layers 126 of the bonding layers 122 is bonded to the insulating layer 116 of the bonding layer 112. At least one thermal treatment may be used for establish bonding between the conductive pads 114, 124 and between the insulating layers 116, 126.

The device dies 120 bonded to the device wafer 110 are laterally spaced apart from one another. A stack of dielectric layers 130 fill up trenches TR extending in between the device dies 120, and laterally enclose each of the device dies 120. According to some embodiments, a total thickness of the dielectric layers 130 is substantially equal to a thickness of the device dies 120, and a topmost surface of the dielectric layers 130 is substantially coplanar with top surfaces of the device dies 120. The dielectric layers 130 are configured to protect the device dies 120 from moisture absorption, corrosion, electrical noise and the like. Quality of the dielectric layers 130 is affected by geometry of the trenches TR, compositions of the dielectric layers 130 and formation method of the dielectric layers 130. For instance, increase of an aspect ratio of the trenches TR (i.e., a ratio of trench height over trench width) may result in more defects in the dielectric layers 130, thus a more promising formation method for forming the dielectric layers 130 and/or optimized compositions of the dielectric layers 130 is/are required. The aspect ratio of the trenches TR increases as a thickness of the device dies 120 increases. Generally, the thickness of the device dies 120 may be equal to or greater than about 5 µm. In more advanced technology generations, the thickness of the device dies 120 may increase to about 100 µm. When the thickness of the device dies 120 is increased to a range of about 5 µm to about 100 µm, an aspect ratio of the trenches TR may range from about 1 to 20, and using chemical vapor deposition (CVD) to form the dielectric layers 130 may result in seams and voids in the deposited dielectric layers 130. On top of that, using CVD for forming the dielectric layers 130 to fill up the high aspect ratio trenches TR may take a long deposition time. In contrast, according to some embodiments of the present disclosure, spin-on-glass (SOG) is used in a solution process (e.g., a spin coating process, an inkjet printing process or a dispensing process) to form each of the dielectric layers 130. Since the SOG is provided as fluid during the solution processes, the SOG can excellently fill up the trenches TR due to its great flowability. The SOG may include a solvent, and include a silicate based material, a siloxane based material or the like dispensed in the solvent. Alternatively, the dielectric layers 130 can be formed of a polymer material, such as polyimide, polybenzoxazole (PBO), benzocyclobutene (BCB), the like or combinations thereof. In these alternative embodiments, a solution process (e.g., a spin coating process, an inkjet printing process or a dispensing process) may be used for forming each of the dielectric layers 130 as well, and the dielectric layers 130 can also be formed with few defect since the polymer material is provided as fluid during the solution process.

As a result of using a solution process for forming each of the dielectric layers 130, the dielectric layers 130 may be formed as non-conformal layers. In other words, the dielectric layers 130 may not conformally extend along sidewalls and bottom surfaces of the trenches TR. Instead, the dielectric layers 130 are stacked on the bottom surfaces of the trenches TR.

According to some embodiments, the dielectric layers 130 include a dielectric layer 130a, a dielectric layer 130b and a dielectric layer 130c. The dielectric layer 130a is the bottommost one of the dielectric layers 130. The dielectric layer 130b is formed on the dielectric layer 130a, and the dielectric layer 130c as a topmost one of the dielectric layers 130 is formed on the dielectric layer 130b. A lower dielectric layer 130 may be subjected to a greater stress. In other words, the dielectric layer 130a may be subjected to a greatest stress, the dielectric layer 130c may be subjected to a minimum stress, and the dielectric layer 130b may be subjected to a medium stress. In order to withstand a greater stress, the dielectric layer 130 at a lower level may be formed with higher mechanical strength, and SOG/polymer with greater viscosity may be used for forming the dielectric layer 130 having greater mechanical strength. According to some embodiments, the dielectric layer 130 formed by the SOG/polymer with greater viscosity has a higher carbon content, as compared to the dielectric layer 130 formed by the SOG/polymer with lower viscosity. In these embodiments, a carbon content in the dielectric layer 130a may be greater than a carbon content in the dielectric layer 130b, which is greater than a carbon content in the dielectric layer 130c. Further, a thickness of each dielectric layer 130 may depend on the viscosity of the SOG/polymer used in the corresponding solution process. The greater the viscosity of the SOG/polymer, the thicker the formed dielectric layer 130 appears. That is, in some embodiments, the dielectric layer 130 at a lower level may have a greater thickness. In other words, a thickness $T_{130a}$ of the dielectric layer 130a may be greater than a thickness $T_{130b}$ of the dielectric layer 130b, and the thickness $T_{130b}$ of the dielectric layer 130b may be greater than a thickness $T_{130c}$ of the dielectric layer 130c. As an example, the viscosity of the SOG/polymer used in a solution process for forming the dielectric layer 130a may range from about 10 cP to about 100 cP; the viscosity of the SOG/polymer used in a solution process for forming the dielectric layer 130b may range from about 10 cP to about 90 cP; and the viscosity of the SOG/polymer used in a solution process for forming the dielectric layer 130c may be less than about 10 cP. In addition, the thickness $T_{130a}$ may range from about 20 um to about 100 um; the thickness $T_{130b}$ may range from about 5 um to about 20 um; and the thickness $T_{130c}$ may range from about 0.5 um to about 5 um.

Due to wetting behavior of SOG/polymer during solution process, the dielectric layer 130a may have a concave top surface $S_{130a}$ with peripheral region higher than central region. On the other hand, the dielectric layer 130a may have a substantially flat bottom surface extending along a top surface of the device wafer 110. As a result, the thickness $T_{130a}$ measured from the substantially flat bottom surface to the concave top surface $S_{130a}$ of the dielectric layer 130a may gradually decrease along a direction away from sidewalls of the device dies 120, to a central portion of the dielectric layer 130a. Similarly, the dielectric layer 130b may also have a concave top surface $S_{130b}$ with peripheral region higher than central region. Since a bottom surface of the dielectric layer 130b extends along the concave top surface $S_{130a}$ of the dielectric layer 130a, the thickness $T_{130b}$ measured from the concave bottom surface to the concave top surface $S_{130b}$ of the dielectric layer 130b may be substantially constant across the trenches TR between the device dies 120. As different from the dielectric layers 130a, 130b, the dielectric layer 130c may have a substantially flat top surface $S_{130c}$, and a bottom surface extending along the concave top surface $S_{130b}$ of the dielectric layer 130b. Accordingly, the thickness $T_{130c}$ of the dielectric layer 130c may increase along the direction away from the sidewalls of the device dies 120. According to some embodiments, the top surface $S_{130c}$ of the dielectric layer 130c is substantially coplanar with the top surfaces of the device dies 120.

Further, by limiting amount of the SOG/polymer used in the solution processes for forming the dielectric layers 130a, 130b and/or adjusting parameters of the solution processes (e.g., adjusting spin speed of each spin coating process), topmost ends of the dielectric layers 130a, 130b may be controlled to be lower than the top surfaces of the device dies 120. As shown in FIG. 1, the topmost ends of the dielectric layers 130a, 130b at the sidewalls of the device dies 120 are lower than the top surfaces of the device dies 120, and the topmost end of the dielectric layer 130a is further lower than the topmost end of the dielectric layer 130b. Moreover, the dielectric layers 130a, 130b are completely covered by the dielectric layer 130c.

As described above, the dielectric layers 130 are each formed by a solution process (e.g., a spin coating process, an inkjet printing process or a dispensing process) using fluid SOG/polymer. Due to the flowablility of the fluid SOG/polymer, the dielectric layers 130 can be formed with promising quality, even when they are filled in high aspect ratio trenches TR. As defects in the dielectric layers 130 are reduced or absent, the device dies 120 can be better protected by the dielectric layers 130 from possible damages including moisture absorption, corrosion, electrical noise and the like. Further, the dielectric layer 130 at a lower level is formed with greater mechanical strength for withstanding larger stress, such that the quality of the dielectric layers 130 can be even more promised. On top of that, as compared to using CVD processes, using solution processes for forming the dielectric layers 130 may improve throughput.

It should be noted that, although the dielectric layers 130 are described as having three dielectric layers 130a, 130b, 130c, the dielectric layers 130 can alternatively have less than three dielectric layers or more than three dielectric layers 130 (e.g., two to five dielectric layers 130), as along as the dielectric layer 130 at a lower level is formed by SOG/polymer with greater viscosity and greater thickness. Those skilled in the art may adjust an amount of the dielectric layers 130 according to manufacturing process and/or die thickness. The present disclosure is not limited to the amount of the dielectric layers 130.

Figure 2:
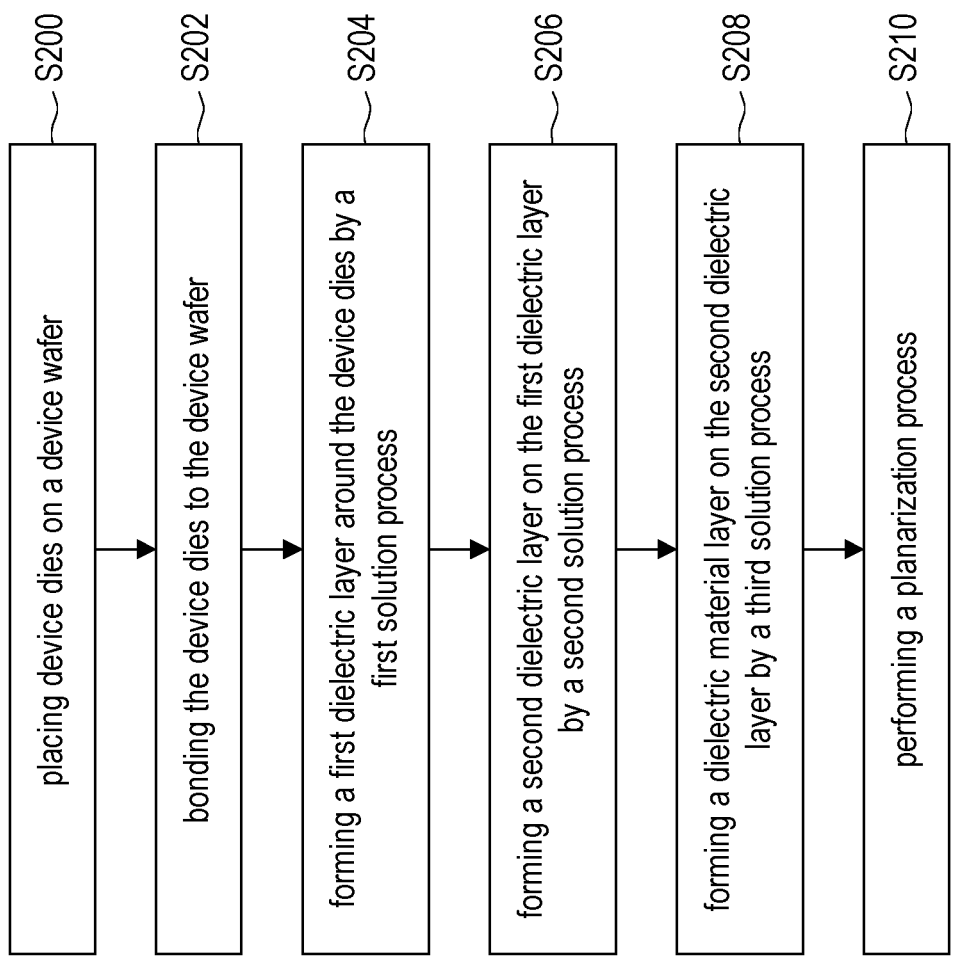
FIG. 2 is a flow diagram illustrating a process for forming the package structure as shown in FIG. 1, according to some embodiments of the present disclosure.

FIG. 2 is a flow diagram illustrating a process for forming the package structure 100, according to some embodiments of the present disclosure. FIG. 3A through FIG. 3D are schematic cross-sectional views illustrating intermediate structures at various stages during the manufacturing process as shown in FIG. 2.

Figure 3A:
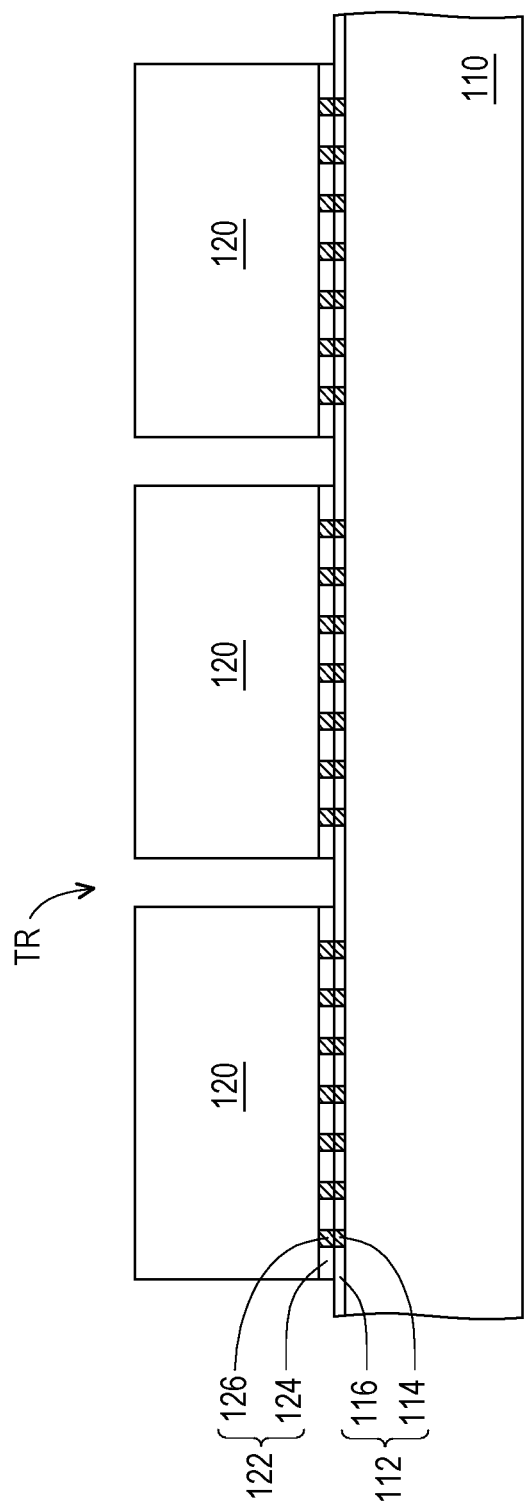
FIG. 3A through FIG. 3D are schematic cross-sectional views illustrating intermediate structures at various stages during the manufacturing process as shown in FIG. 2.

Referring to FIG. 2 and FIG. 3A, step S200 is performed, and the device dies 120 are picked and placed onto the device wafer 110. The device dies 120 are separately placed on the device die 110, and the trenches TR are defined between the device dies 120. According to some embodiments, the bonding layers 122 of the device dies 120 are in contact with the bonding layer 112 of the device wafer 110. In these embodiments, the conductive pads 124 in the bonding layers 122 are positioned on the conductive pads 114 in the bonding layer 112, while the insulating layer 124 of the bonding layer 122 is in contact with the insulating layer 116 of the bonding layer 112.

Thereafter, step S202 is performed, and the device dies 120 are bonded to the device wafer 110. According to some embodiments, the device dies 120 are bonded to the device wafer 110 via a hybrid bonding process. In these embodiments, the conductive pads 124 in the bonding layers 122 of the device dies 120 are bonded to the conductive pads 114 in the bonding layer 112 of the device wafer 110, and the insulating layers 124 of the bonding layers 122 are bonded to the insulating layer 116 of the bonding layer 112. A thermal treatment is involved for bonding the conductive pads 124 in the bonding layers 122 to the conductive pads 114 in the bonding layer 112, and another thermal treatment may be performed for bonding the insulating layers 126 of the bonding layers 122 to the insulating layer 116 of the bonding layer 112. A process temperature of the thermal treatment for bonding the insulating layers 116, 126 may be lower than a process temperature of the thermal treatment for bonding the conductive pads 114, 124. In addition, the thermal treatment for bonding the insulating layers 116, 126 may precede the thermal treatment for bonding the conductive pads 114, 124. Alternatively, the thermal treatment for bonding the insulating layers 116, 126 may follow the thermal treatment for bonding the conductive pads 114, 124.

Figure 3B:
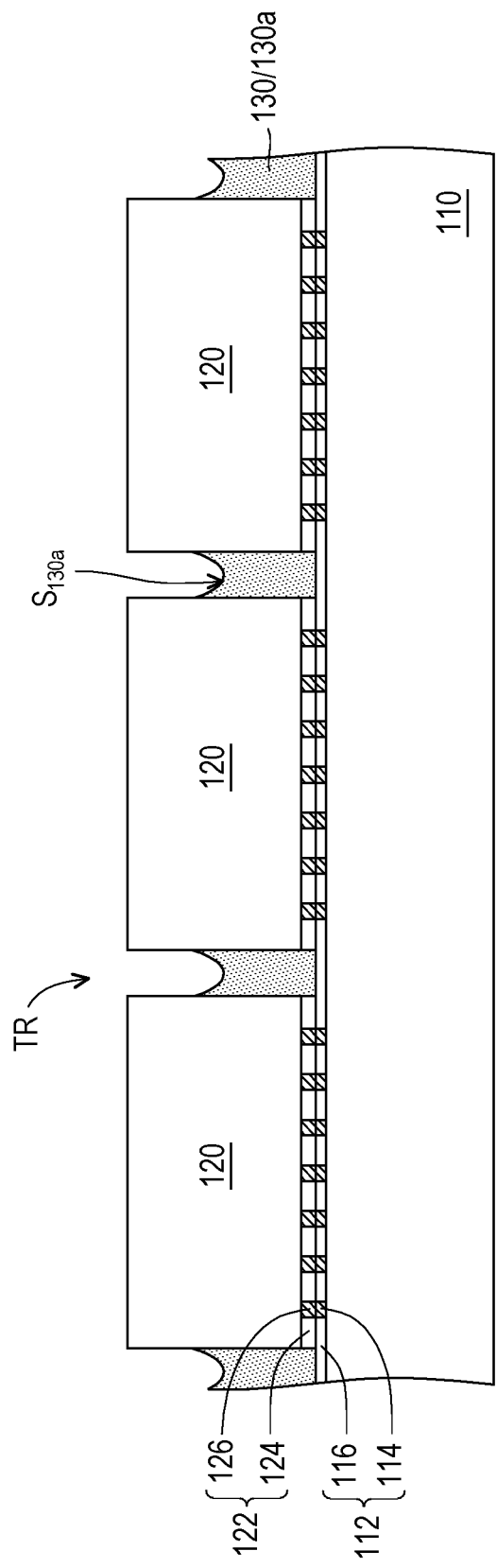

Referring to FIG. 3B, step S204 is performed, and the bottommost one of the dielectric layers 130 (i.e., the dielectric layer 130a) is formed around the device dies 120. A first SOG/polymer may be used in a first solution process for forming the dielectric layer 130a. In some embodiments, the first solution process is a spin coating process. During the spin coating process, the bonded structure as shown in FIG. 3A is spun at a pre-determined speed. Meanwhile, the first SOG/polymer is spread on the spinning structure. Subsequently, the coated structure is baked to drive off solvent in the first SOG/polymer, and to solidify the coating for forming the dielectric layer 130a. In alternative embodiments, the first solution process is an inkjet printing process. In other embodiments, the first solution process is a dispensing process. According to various embodiments, the coating can be confined in the trenches TR by limiting an amount of the first SOG/polymer, and/or adjusting parameters of the first solution process (e.g., adjusting spin speed of a spin coating process). Further, due to wetting behavior of the first SOG/polymer, the resulting dielectric layer 130a may extend upwardly along the sidewalls of the device dies 120, thus have the concave top surface $S_{130a}$.

Figure 3C:
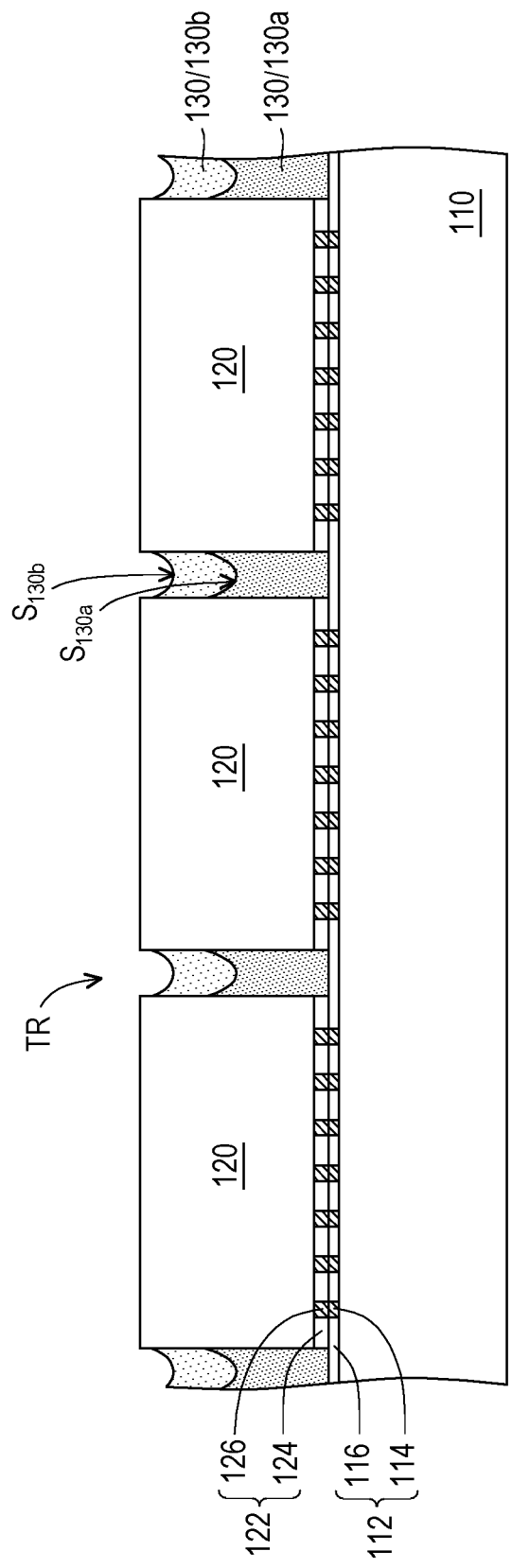

Referring to FIG. 2 and FIG. 3C, step S206 is performed, and another dielectric layer 130 (i.e., the dielectric layer 130b) is formed on the bottommost dielectric layer 130a. A second SOG/polymer may be used in a second solution process for forming the dielectric layer 130b. In some embodiments, the second solution process is a spin coating process. During the spin coating process, the current structure is spun at a pre-determined speed. Meanwhile, the second SOG/polymer is spread on the spinning structure. Subsequently, the coated structure is baked to drive off solvent in the second SOG/polymer, and to solidify the coating for forming the dielectric layer 130b. In alternative embodiments, the second solution process is an inkjet printing process. In other embodiments, the second solution process is a dispensing process. According to various embodiments, the coating can also be confined in the trenches TR by limiting an amount of the second SOG/polymer, and/or adjusting parameters of the second solution process (e.g., adjusting spin speed of a spin coating process). In addition, due to wetting behavior of the second SOG/polymer, the formed dielectric layer 130b may extend upwardly along the sidewalls of the device dies 120, thus have the concave top surface S130b. As compared to the first SOG/polymer used in the first solution process, the second SOG/polymer used in the second solution process may have a lower viscosity. Accordingly, the formed dielectric layer 130b may have a smaller thickness and a lower carbon content, as compared to the dielectric layer 130a formed by using the first SOG/polymer.

Figure 3D:
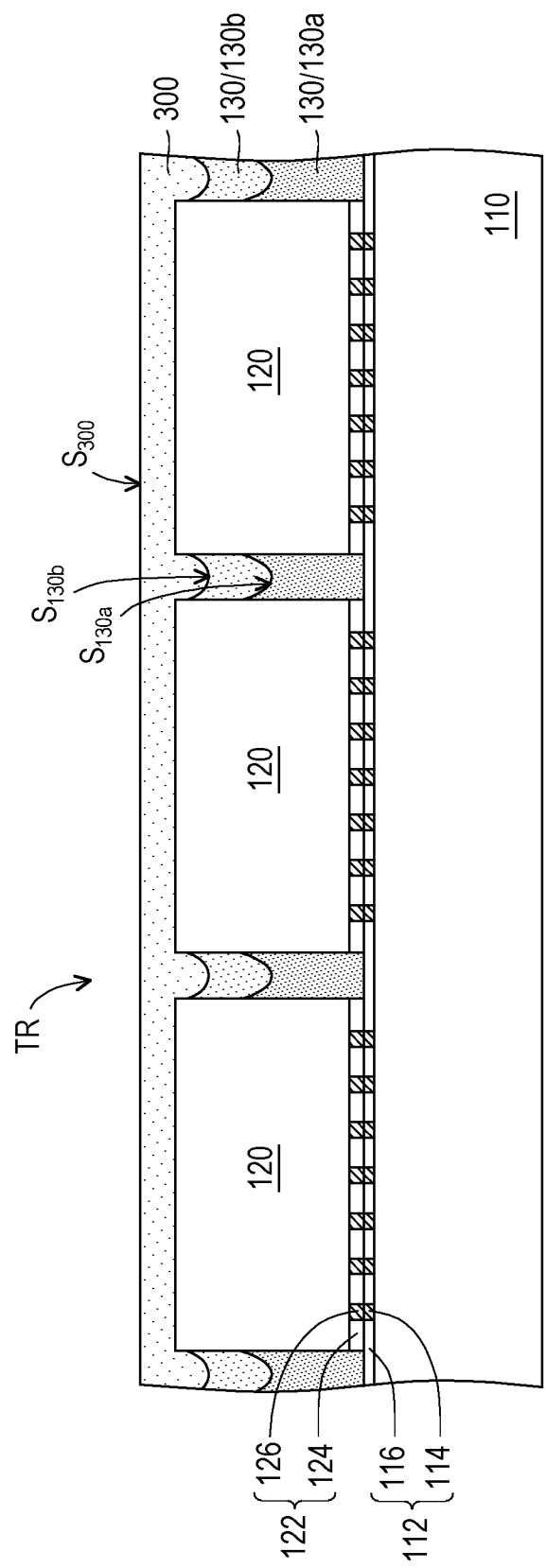

Referring to FIG. 2 and FIG. 3D, step S208 is performed, and a dielectric material layer 300 is formed on the dielectric layer 130b. The dielectric material layer 300 will be thinned to form the dielectric layer 130c as described with reference to FIG. 1. A third SOG/polymer may be used in a third solution process for forming the dielectric material layer 300. In some embodiments, the third solution process is a spin coating process. During the spin coating process, the current structure is spun at a pre-determined speed. Meanwhile, the third SOG/polymer is spread on the spinning structure. Subsequently, the coated structure is baked to drive off solvent in the third SOG/polymer, and to solidify the coating for forming the dielectric material layer 300. In alternative embodiments, the third solution process is an inkjet printing process. In other embodiments, the third solution process is a dispensing process. As compared to the first SOG/polymer and the second SOG/polymer used in the first and second solution processes, the third SOG/polymer used in the third solution may have a lower viscosity. Accordingly, the formed dielectric material layer 300 may have a lower carbon content, as compared to the dielectric layers 130a, 130b formed by using the first SOG/polymer and second SOG/polymer. As another difference from the dielectric layers 130a, 130b, the dielectric material layer 300 may fill up the trenches TR, and may partially or completely cover the device dies 120. A top surface $S_{300}$ of the dielectric material layer 300 may be substantially flat due to the low viscosity (i.e., high flowability) of the third SOG/polymer used for forming the dielectric material layer 300.

Thereafter, step S210 is performed, and a planarization process is executed. As a result, the dielectric material layer 300 is thinned to form the dielectric layer 130c as shown in FIG. 1. During the planarization process, portions of the dielectric material layer 300 above the top surfaces of the device dies 120 are removed, and portions of the dielectric material layer 300 remained around the device dies 120 form the dielectric layer 130c. As a result of the planarization process, the top surface $S_{130c}$ of the dielectric layer 130c may be substantially flat, and may be substantially coplanar with the top surfaces of the device dies 120. According to some embodiments, the device dies 120 may be further thinned during the planarization process. As examples, the planarization process may include a polishing process, an etching process or a combination thereof.

In alternative embodiments where an amount of the dielectric layers 130 is less than three, at least one of the steps S204, S206 may be omitted. In other embodiments where an amount of dielectric layers 130 is greater than three, at least one additional step may be inserted among the steps S204, S206, S208 for forming additional dielectric layer(s) 130, and the additional step is similar to each of the steps S204, S206, S208 except that viscosity of the SOG/polymer used for forming the additional dielectric layer 130 is different from the viscosity of each of the first to third SOG/polymers used for forming the dielectric layers 130a, 130b, 130c.

The resulting structure may be subjected to further packaging process(es). As an example, the current structure may be singulated.

Figure 4:
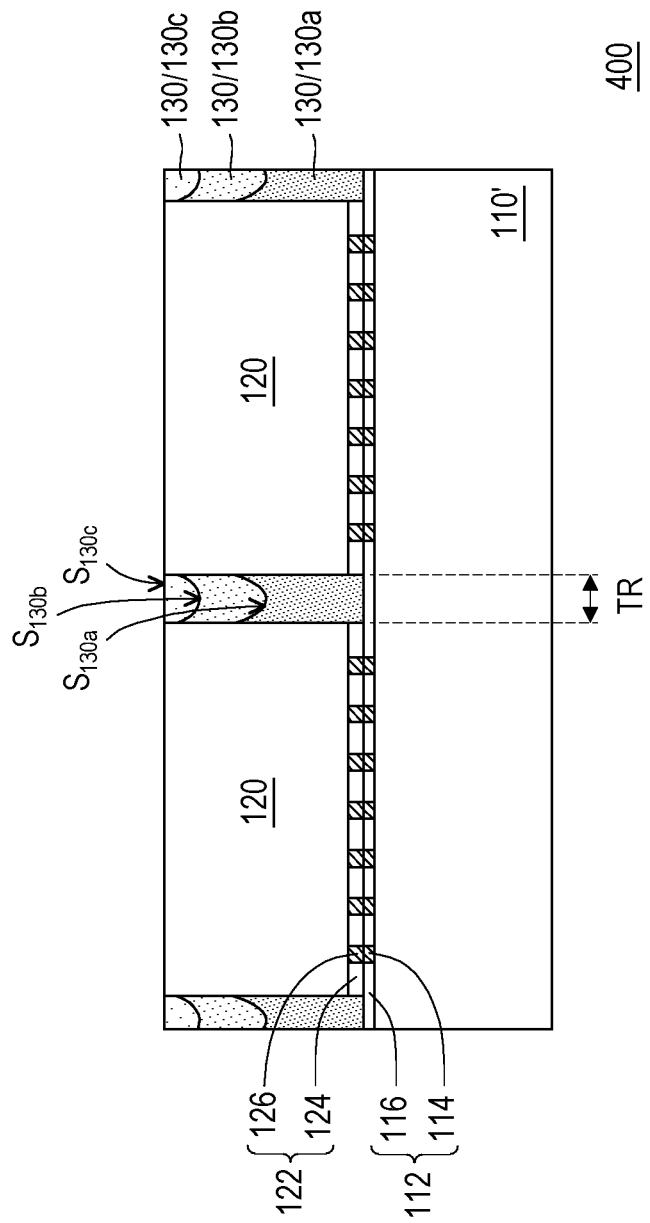
FIG. 4 is a schematic cross-sectional view illustrating a die stacking structure singulated from the package structure as shown in FIG. 1, according to some embodiments of the present disclosure.

FIG. 4 is a schematic cross-sectional view illustrating a die stacking structure 400 singulated from the package structure 100 as shown in FIG. 1, according to some embodiments of the present disclosure.

Referring to FIG. 4, the die stacking structure 400 is originated from the package structure 100 described with reference to FIG. 1. A singulation process may be performed on the package structure 100, and the die stacking structure 400 is one of the structures singulated from the package structure 100. A device die 110' bonded with some of the device dies 120 is singulated from the device wafer 110. During the singulation, the stack of dielectric layers 130 are cut along a sidewall of the device die 110'. Accordingly, the singulated dielectric layers 130 in the die stacking structure 400 may have sidewalls substantially coplanar with the sidewall of the device die 110'.

According to alternative embodiments where a package structure includes less or more than three dielectric layers 130, a die stacking structure singulated from such package structure includes a same amount of dielectric layers 130.

Figure 5:
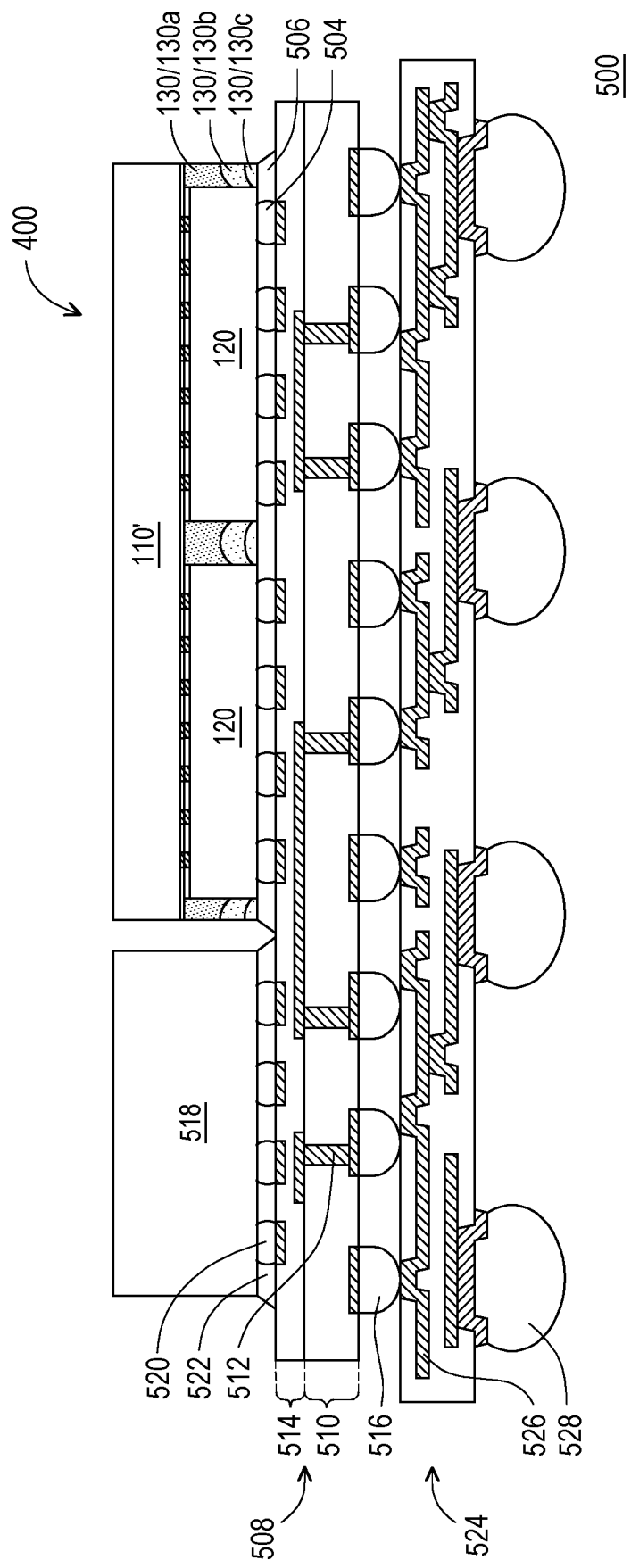
FIG. 5 is a schematic cross-sectional view illustrating a semiconductor package, according to some embodiments of the present disclosure.

FIG. 5 is a schematic cross-sectional view illustrating a semiconductor package 500, according to some embodiments of the present disclosure.

Referring to FIG. 5, the die stacking structure 400 as described with reference to FIG. 4 may be included in the semiconductor package 500, but may be flipped over. According to some embodiments, electrical connectors 504 are formed at a side of the die stacking structure 400, and functioned as inputs/outputs (I/Os) of the device dies 110', 120 in the die stacking structure 400. As an example, the electrical connectors 504 are deployed at a side of die stacking structure 400 close to the device dies 120 and the dielectric layers 130 (e.g., a bottom side of the die stacking structure 400). Further, a backside interconnection structure (not shown) for routing the device dies 120 to the electrical connectors 504 may be disposed between the device dies 120 and the electrical connectors 504, and between the dielectric layers 130 and the electrical connectors 504. An optional underfill 506 may be formed to laterally surround the electrical connectors 504.

In some embodiments, the die stacking structure 400 is bonded to an interposer 508. The electrical connectors 504 may be used to establish contact between the die stacking structure 400 and the interposer 508. The interposer 508 may include a substrate 510 (e.g., a semiconductor substrate or an organic substrate) and through substrate vias 512 penetrating through the substrate 510. In addition, the interposer 508 may further include an interconnection structure 514 lying along a side of the substrate 510 facing toward the die stacking structure 400. The electrical connectors 504 can be routed to the other side of the substrate 510 through interconnection elements (e.g., conductive wirings and conductive vias) in the interconnection structure 514 and the through substrate vias 512 penetrating the substrate 510. Moreover, electrical connectors 516 may be formed at the side of the substrate 510 facing away from the die stacking structure 400, as interface to another package component. As an example, the electrical connectors 516 may be controlled collapse chip connection (C4) bumps.

In addition to the die stacking structure 400, other package components may also be bonded to the interposer 508. For instance, a memory die 518 is also bonded to the interposer 508, and arranged aside the die stacking structure 400. Electrical connectors 520 may be used for establishing contact between the memory die 518 and the interposer 508. As similar to the electrical connectors 504, the electrical connectors 520 may be micro-bumps. Optionally, the electrical connectors 520 may be laterally surrounded by an underfill 522.

Furthermore, the interposer 508 may be bonded onto a package substrate 524 via the electrical connectors 516. Interconnection elements 526 including conductive wirings and conductive vias may be formed in the package substrate 524, to establish routing paths between opposite sides of the package substrate 524. That is, the electrical connectors 516 at one side of the package substrate 524 can be routed to the other side of the package substrate 524 through these interconnection elements 526. In some embodiments, electrical connectors 528 as I/Os of the semiconductor package 500 are disposed at the side of the package substrate 524 facing away from the interposer 508, and are electrically connected to the interconnection elements 526 in the package substrate 524. As an example, the electrical connectors 528 may be ball grid array (BGA) balls.

Figure 6:
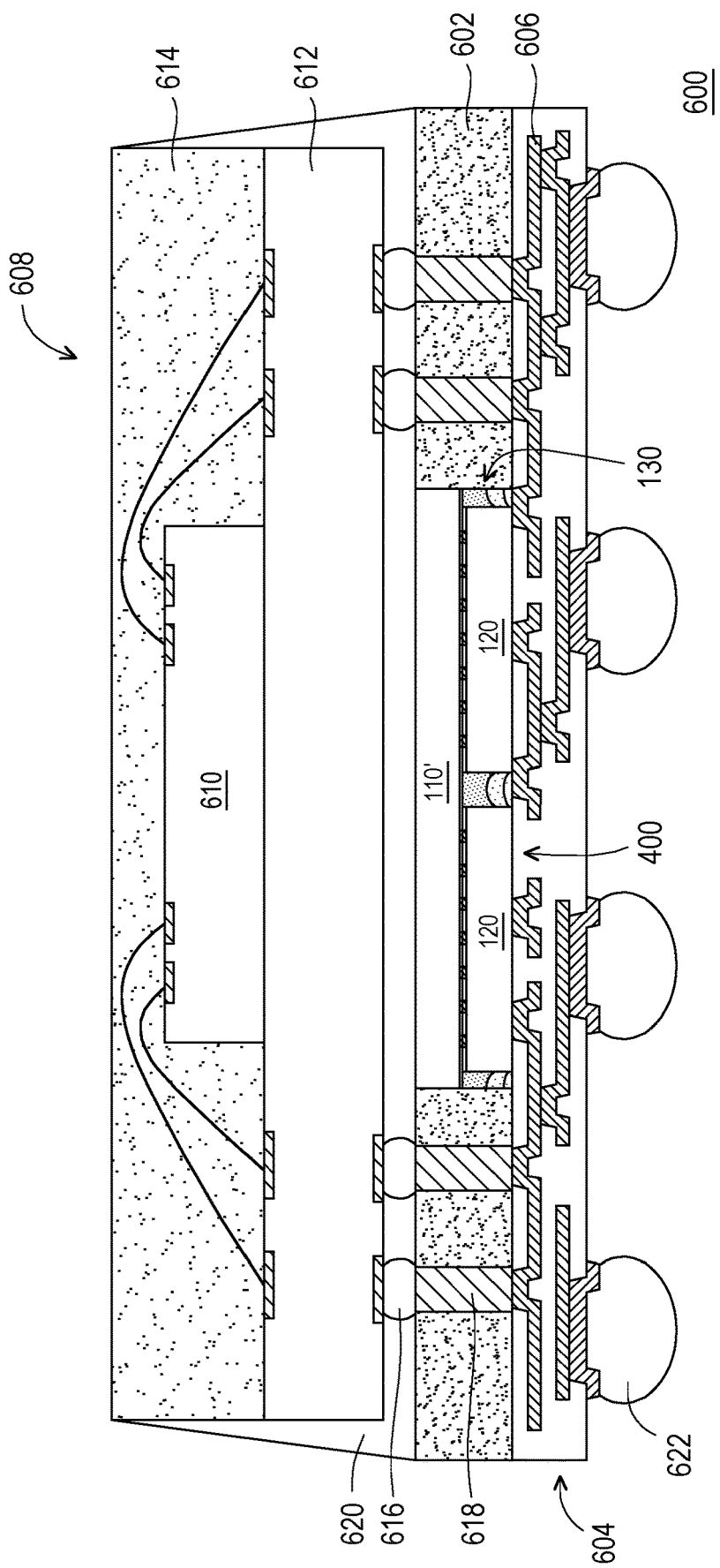
FIG. 6 is a schematic cross-sectional view illustrating a semiconductor package, according to some embodiments of the present disclosure.

FIG. 6 is a schematic cross-sectional view illustrating a semiconductor package 600, according to some embodiments of the present disclosure.

Referring to FIG. 6, as another example, the die stacking structure 400 singulated from the package structure 100 as shown in FIG. 1 is applied to a semiconductor package 600. In the semiconductor package 600, the die stacking structure 400 is laterally encapsulated by an encapsulant 602, which may be formed of a molding compound. A redistribution structure 604 is formed at a bottom side of the die stacking structure 400, and also extends along a bottom side of the encapsulant 602. Redistribution elements 606 including conductive wirings and conductive vias are formed in the redistribution structure 604, and are configured to rout the device dies 110', 120 in the die stacking structure 400 to another side of the redistribution structure 604 via a fan-out manner. Although not shown, an optional backside interconnection structure for electrically connecting the die stacking structure 400 to the redistribution structure 604 may be disposed between the device dies 120 and the redistribution structure 604, and between the dielectric layers 130 and the redistribution structure 604.

According to some embodiments, a semiconductor package 608 (e.g., memory package) is attached to a top side of the encapsulant 602. The semiconductor package 608 may include a semiconductor die 610 (e.g., a memory die) and a package substrate 612 lying below the semiconductor die 610. The semiconductor die 610 is bonded to the package substrate 612 (e.g., by a wire bonding manner), and may be laterally encapsulated by an encapsulant 614. Interconnection elements (not shown) formed in the package substrate 612 are configured to rout the semiconductor die 610 to a bottom side of the package substrate 612 facing toward the encapsulated die stacking structure 400. Further, electrical connectors 616 disposed at the bottom side of the substrate 612 may be used to establish contact between the semiconductor package 608 and the encapsulant 602. In these embodiments, through encapsulant vias 618 may be formed through the encapsulant 602 for connecting the electrical connectors 616 to the redistribution elements 606 in the redistribution structure 604. Therefore, the semiconductor package 608 can be routed to the bottom side of the redistribution structure 604 and/or interconnected with the die stacking structure 400 through the electrical connectors 616, the through encapsulant vias 618 and the redistribution elements 606 in the redistribution structure 604. In some embodiments, the electrical connectors 616 are laterally surrounded by an underfill 620. In addition, in some embodiments, electrical connectors 622 formed at the bottom side of the redistribution structure 604 are electrically connected to the redistribution elements 606 in the redistribution structure 604, and functioned as I/Os of the semiconductor package 600.

In other embodiments where a package structure includes less or more than three dielectric layers 130, a die stacking structure singulated from the package structure can also be used in a variety of three dimensional semiconductor packages. For instance, such die stacking structure may replace the die stacking structure 400 in the semiconductor package 500 or the die stacking structure 400 in the semiconductor package 600.

Figure 7:
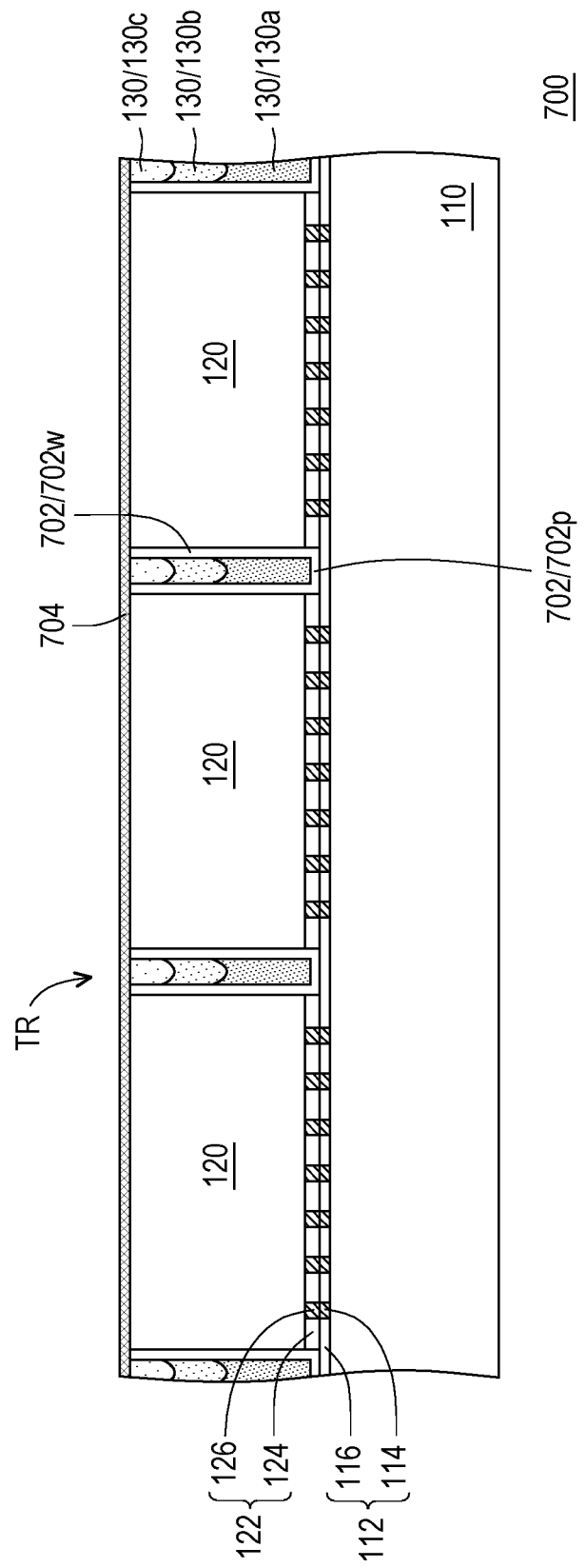
FIG. 7 is a schematic cross-sectional view illustrating a package structure, according to some other embodiments of the present disclosure.

FIG. 7 is a schematic cross-sectional view illustrating a package structure 700, according to some other embodiments of the present disclosure.

As similar to the semiconductor package 100 as described with reference to FIG. 1, the package structure 700 as shown in FIG. 7 also includes the device wafer 110 and the device dies 120 bonded to the device wafer 110. In addition, the package structure 700 also includes a stack of dielectric layers 130 filled in the trenches TR extending in between the device dies 120 and laterally surrounding each of the device dies 120. According to some embodiments, the dielectric layers 130 include the dielectric layer 130a, the dielectric layer 130b and the dielectric layer 130c. In alternative embodiments, the dielectric layers 130 have less than three or more than three dielectric layers 130 (e.g., two to five dielectric layers 130).

As a difference from the package structure 100, the package structure 700 may further include an adhesion layer 702 conformally lining along bottom surfaces and sidewalls of the trenches TR before formation of the dielectric layers 130, and configured to enhance adhesion between the dielectric layers 130 and the device dies 120, and adhesion between the dielectric layers 130 and the device wafer 110. Wall portions 702w of the adhesion layer 702 extend along sidewalls of the device dies 120, and the dielectric layers 130 are in laterally contact with the device dies 120 through the wall portions 702w of the adhesion layer 702. According to some embodiments, topmost ends of the wall portions 702w are substantially coplanar with top surfaces of the device dies 120. In addition, planar portions 702p of the adhesion layer 702 extend along a top surface of the device wafer 110, and the dielectric layers 130 are in contact with the underlying device wafer 110 through the planar portions 702p of the adhesion layer 702. According to some embodiments, the adhesion layer 702 is formed of silicon oxide, silicon nitride or the like, and a method for forming the adhesion layer 702 may include a CVD process. In addition, in some embodiments, a thickness of the adhesion layer 702 ranges from about 100 nm to about 1000 nm.

According to some embodiments, the package structure 700 further includes a protection layer 704 extending along a top side of the package structure 700. The device dies 120 are covered by the protection layer 704, and can be protected by the protection layer 704 from possible damages while the package structure 700 is subjected to further processes. In addition, the dielectric layers 130 and the adhesion layer 702 are also covered by the protection layer 704. In this way, the dielectric layers 130 are wrapped by the adhesion layer 702 and the protection layer 704. The protection layer 704 is formed of an insulating material, such as silicon nitride. In some embodiments, a method for forming the protection layer 704 includes a CVD process. In addition, in some embodiments, a thickness of the protection layer 704 ranges from about 500 Å to about 5000 Å.

Figure 8:
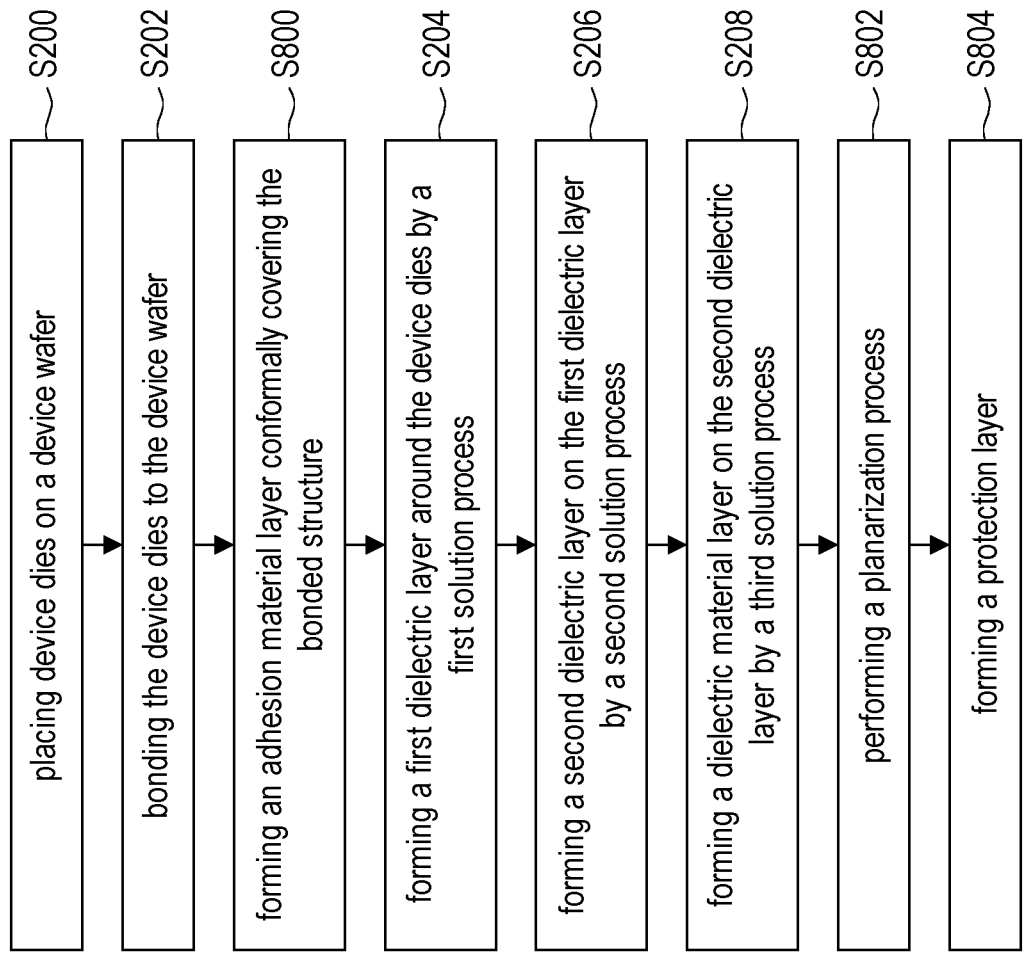
FIG. 8 is a flow diagram illustrating a process for forming the package structure as shown in FIG. 7, according to some embodiments of the present disclosure.
Figure 9A:
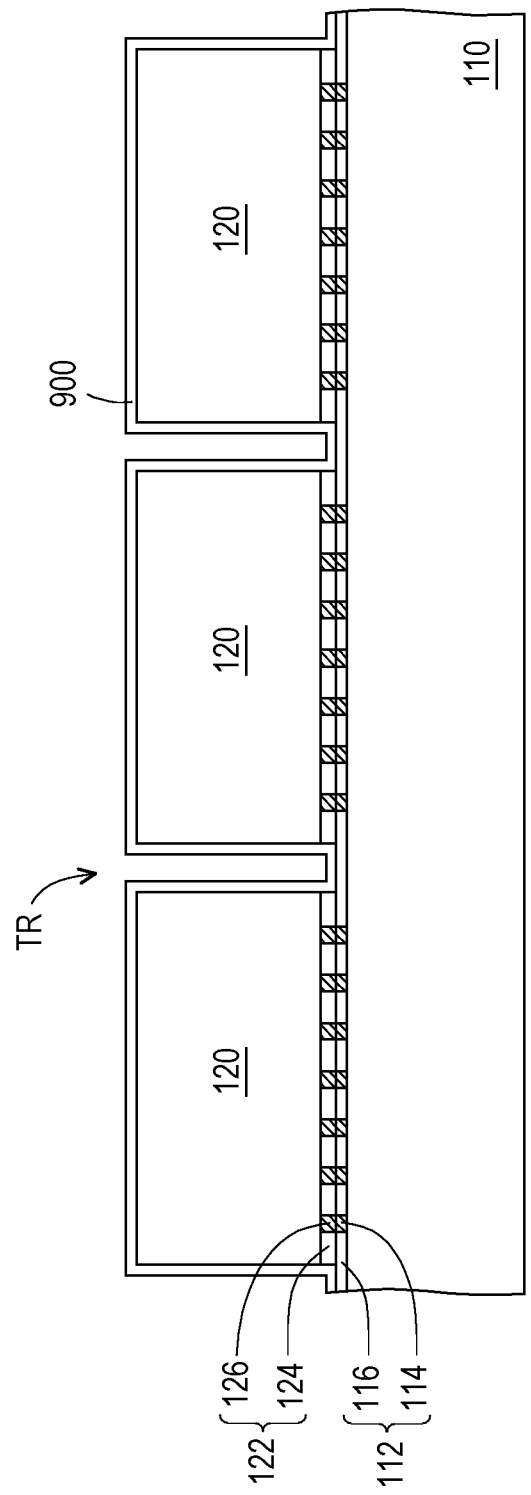
FIG. 9A through FIG. 9C are schematic cross-sectional views illustrating intermediate structures at various stages during the manufacturing process as shown in FIG. 8.
Figure 9B:
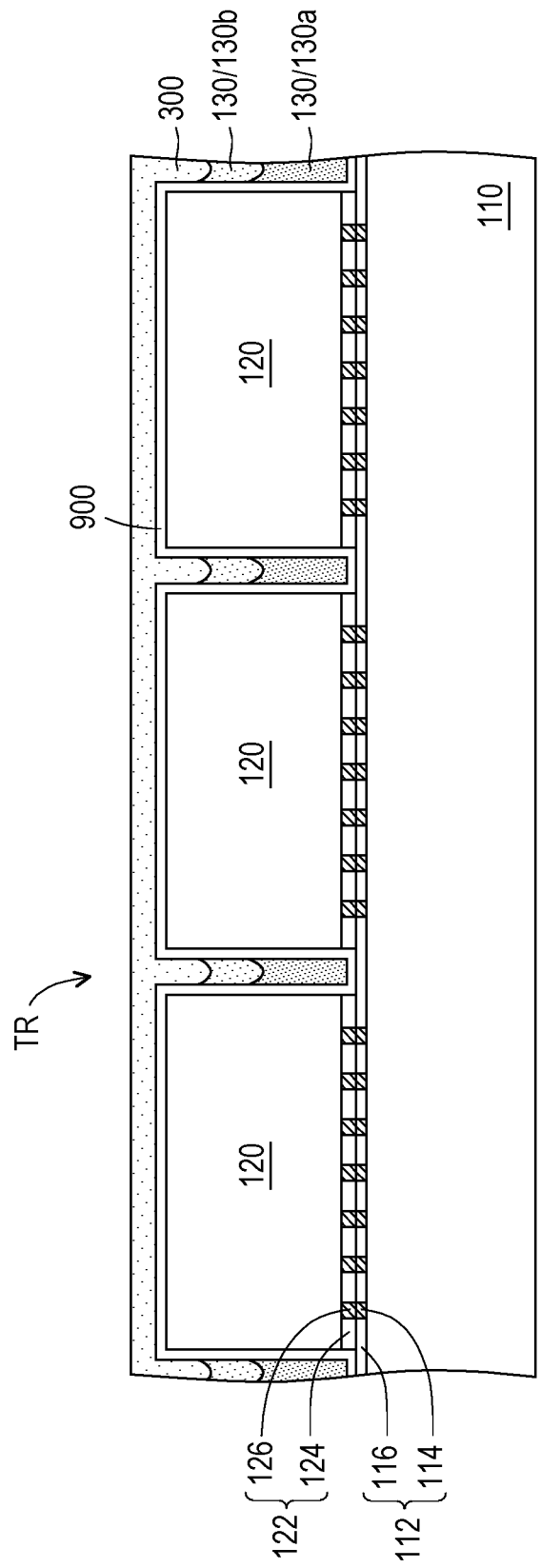
Figure 9C:
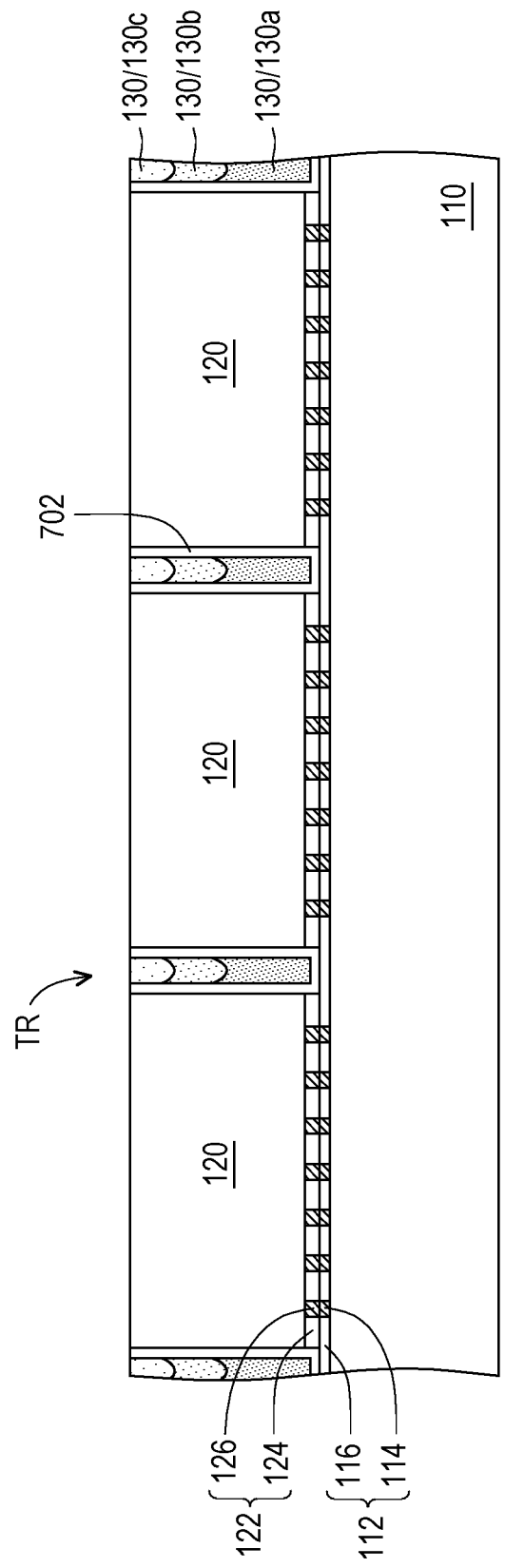

FIG. 8 is a flow diagram illustrating a process for forming the package structure 700, according to some embodiments of the present disclosure. FIG. 9A through FIG. 9C are schematic cross-sectional views illustrating intermediate structures at various stages during the manufacturing process as shown in FIG. 8.

The process for forming the package structure 700 may begin with the steps S200, S202 as described with reference to FIG. 2 and FIG. 3A. Subsequently, as shown in FIG. 8 and FIG. 9A, step S800 is performed, and an adhesion material layer 900 is conformally formed on the bonded structure. The adhesion material layer 900 will be shaped to form the adhesion layer 702 as described with reference to FIG. 7. Currently, the device wafer 110 and the device dies 120 are conformally covered by the adhesion material layer 900. In some embodiments, the adhesion material layer 900 is formed of silicon nitride or silicon oxide, and a method for forming the adhesion material layer 900 includes performing a CVD process.

Thereafter, the steps S204, S206, S208 as described with reference to FIG. 2 and FIG. 3A through FIG. 3D are performed, and a resulting structure is shown in FIG. 9B. The trenches TR being lined with the adhesion material layer 900 are filled up by the dielectric layers 130a, 130b and the dielectric material layer 300, and the dielectric material layer 300 may further cover portions of the adhesion material layer 900 extending along the top surfaces of the device dies 120.

Referring to FIG. 8 and FIG. 9C, step S802 is then performed, and a planarization process is executed. As a result, portions of the dielectric material layer 300 and the adhesion material layer 900 above the top surfaces of the device dies 120 are removed. Remained portions of the dielectric material layer 300 form the dielectric layer 130c, while remained portions of the adhesion material layer 900 form the adhesion layer 702. According to some embodiments, the device dies 120 may be further thinned during the planarization process. As examples, the planarization process may include a polishing process, an etching process or a combination thereof.

Subsequently, step S804 is performed, and the protection layer 704 is formed. The resulting structure is shown in FIG. 7. According to some embodiments, the protection layer 704 is formed of silicon nitride, and a method for forming the protection layer 703 includes performing a CVD process.

In alternative embodiments where an amount of the dielectric layers 130 is less than three, at least one of the steps S204, S206 may be omitted. In other embodiments where an amount of dielectric layers 130 is greater than three, at least one additional step may be inserted among the steps S204, S206, S208 for forming additional dielectric layer(s) 130, and the additional step is similar to each of the steps S204, S206, S208 except that viscosity of the SOG/polymer used for forming the additional dielectric layer 130 is different from the viscosity of each of the first to third SOG/polymers used for forming the dielectric layers 130a, 130b, 130c.

The resulting structure may be subjected to further packaging process(es). As an example, the current structure may be singulated.

Figure 10:
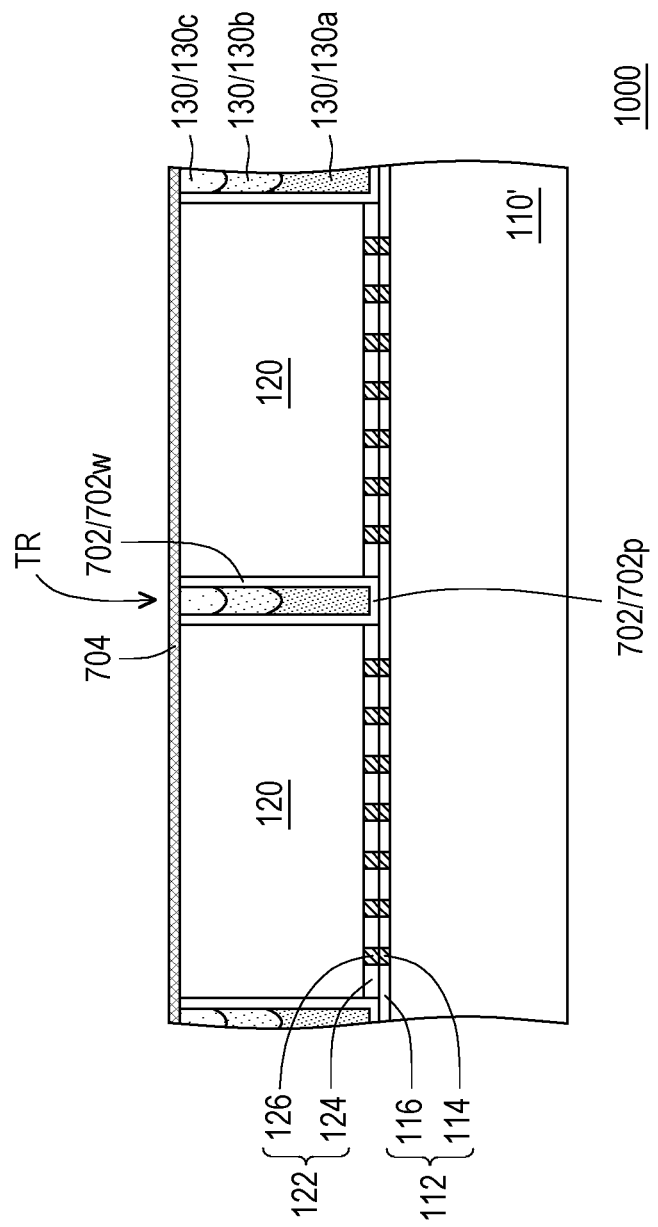
FIG. 10 is a schematic cross-sectional view illustrating a die stacking structure singulated from the package structure as shown in FIG. 7, according to some embodiments of the present disclosure.

FIG. 10 is a schematic cross-sectional view illustrating a die stacking structure 1000 singulated from the package structure 700 as shown in FIG. 7, according to some embodiments of the present disclosure.

Referring to FIG. 10, the die stacking structure 1000 is originated from the package structure 700 described with reference to FIG. 7. A singulation process may be performed on the package structure 700, and the die stacking structure 1000 is one of the structures singulated from the package structure 700. The device die 110' bonded with some of the device dies 120 is singulated from the device wafer 110. During the singulation, the stack of dielectric layers 130, the adhesion layer 702 and the protection layer 704 are cut along a sidewall of the device die 110'. Accordingly, the singulated dielectric layers 130, adhesion layer 702 and protection layer 704 in the die stacking structure 400 may have sidewalls substantially coplanar with the sidewall of the device die 110'.

Further, the die stacking structure 1000 can be applied to a variety of three dimensional semiconductor packages. For instance, the die stacking structure 1000 may replace the die stacking structure 400 in the semiconductor package 500 as shown in FIG. 5 or the die stacking structure 400 in the semiconductor package 600 as shown in FIG. 6.

According to alternative embodiments where a package structure similar to the package structure 700 as shown in FIG. 7 but includes less or more than three dielectric layers 130, a die stacking structure singulated from such package structure includes a same amount of dielectric layers 130. Further, such die stacking structure can be used in a variety of three dimensional semiconductor packages (e.g., the semiconductor package 500 as shown in FIG. 5, the semiconductor package 600 as shown in FIG. 6 or the like).

Figure 11:
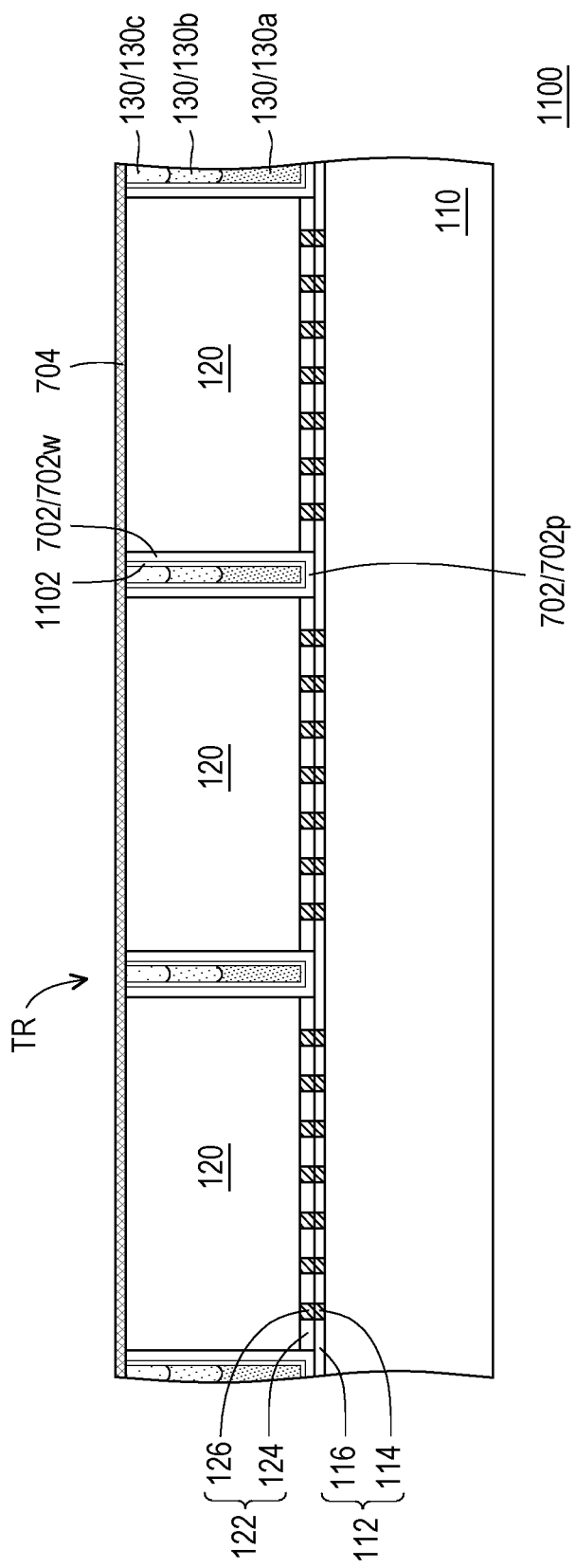
FIG. 11 is a schematic cross-sectional view illustrating a package structure, according to some other embodiments of the present disclosure.

FIG. 11 is a schematic cross-sectional view illustrating a package structure 1100, according to some other embodiments of the present disclosure.

The package structure 1100 is similar to the package structure 700 as described with reference to FIG. 7, except that the package structure 1100 includes multiple adhesion layers lining between the dielectric layers 130 and the device dies 120, and between the dielectric layers 130 and the device wafer 110. According to some embodiments, the adhesion layer 702 and an additional adhesion layer 1102 extend along a bottom surface and sidewalls of the dielectric layers 130, and cover a top surface of the device wafer 110 as well as sidewalls of the device dies 120. The adhesion layer 1102 is sandwiched between the adhesion layer 702 and the dielectric layers 130. Topmost ends of the adhesion layers 702, 1102 may be substantially coplanar with a topmost surface of the dielectric layers 130 and top surfaces of the device dies 120, and are covered by the protection layer 704, along with the dielectric layers 130 and the device dies 120.

In some embodiments, the adhesion layers 702, 1102 are formed of different materials, and may be formed by different methods. For instance, as described with reference to FIG. 7, the adhesion layer 702 may be formed of silicon oxide, silicon nitride or the like, and a method for forming the adhesion layer 702 may include a CVD process. On the other hand, the adhesion layer 1102 may be formed of SOG, and a spin coating process may be used for forming the adhesion layer 1102. Furthermore, in some embodiments, a thickness of the adhesion layer 1102 is less than a thickness of the adhesion layer 702. For instance, the thickness of the adhesion layer 702 may range from about 100 nm to about 1000 nm, while the thickness of the adhesion layer 1102 may range from about 10 nm to about 1000 nm.

A process for forming the package structure 1100 is similar to the process described with reference to FIG. 8 and FIG. 9A through FIG. 9C, except that an additional step for forming the adhesion layer 1102 is performed before the step S800 for forming an additional adhesion material layer to be shaped to form the adhesion layer 1102. Further, during the planarization process performed in the step S802, portions of such additional adhesion material layer over the top surfaces of the device dies 120 are removed, and remained portions of the additional adhesion material layer form the adhesion layer 1102.

A die stacking structure singulated from the package structure 1100 is similar to the die stacking structure 1000, except that the adhesion layer 1102 extends between the adhesion layer 702 and the dielectric layers 130. Further, as similar to the adhesion layer 702, the adhesion layer 1102 may be terminated at a sidewall of such die stacking structure, and topmost ends of the adhesion layer 1102 may also be covered by the protection layer 704.

As above, a stack of dielectric layers are formed around the device dies for protecting the device dies from possible damages. The dielectric layers are each formed by a solution process using fluid SOG/polymer. Due to the flowability of the fluid SOG/polymer, the dielectric layers can be formed with less defects (e.g., seams and/or voids), even being filled in trenches with high aspect ratio. Further, the dielectric layer at a lower level is formed with greater mechanical strength for withstanding larger stress, such that the quality of the dielectric layers can be even more promised. On top of that, as compared to using CVD processes, using solution processes for forming the dielectric layers may result in a greater throughput.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

In an aspect of the present disclosure, a die stacking structure is provided. The die stacking structure comprises: a first device die; second device dies, bonded onto the first device die, and arranged side-by-side; and a stack of dielectric layers, extending in between the second device dies, and laterally enclosing each of the second device dies, wherein the dielectric layers are respectively formed of a spin-on-glass (SOG) or a polymer, and a lower one of the dielectric layers has a thickness greater than a thickness of another one of the dielectric layers at a higher level.

In another aspect of the present disclosure, a semiconductor package is provided. The semiconductor package comprises: a die stacking structure and a package component electrically connected to the die stacking structure from above or below the die stacking structure. The die stacking structure comprises: a first device die; second device dies, bonded to the first device die and arranged side-by-side; and a stack of dielectric layers, extending in between the second device dies, and laterally enclosing each of the second device dies, wherein the dielectric layers are respectively formed of a spin-on-glass (SOG) or a polymer, and one of the dielectric layers has a thickness greater than a thickness of another one of the dielectric layers more distant from the first device die.

In yet another aspect of the present disclosure, a method for forming a die stacking structure is provided. The method comprises: providing a device wafer; bonding device dies onto the device wafer; performing a first solution process using a first spin-on-glass (SOG) or a first polymer, to form a first dielectric layer laterally enclosing each of the device dies; performing a second solution process using a second SOG or a second polymer, to form a second dielectric layer on the first dielectric layer, wherein a viscosity of the second SOG/polymer is greater than a viscosity of the first SOG/polymer; performing a third solution process using a third SOG or a third polymer, to form a third dielectric layer on the second dielectric layer, wherein a viscosity of the third SOG/polymer is greater than the viscosity of the second SOG/polymer; and performing a singulation process, to cut through the device wafer and the first through third dielectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A die stacking structure, comprising:
a first device die;
second device dies, bonded onto the first device die, and arranged side-by-side; and
a stack of dielectric layers, extending in between the second device dies, and laterally enclosing each of the second device dies, wherein the dielectric layers are respectively formed of a spin-on-glass (SOG) or a polymer, and a lower one of the dielectric layers has a thickness greater than a thickness of another one of the dielectric layers at a higher level,
wherein a topmost one of the dielectric layers has a substantially flat top surface, and others of the dielectric layers each have a top surface concave toward the first device die.

2. The die stacking structure according to claim 1, wherein a mechanical strength of a lower one of the dielectric layers is greater than a mechanical strength of another one of the dielectric layers at a higher level.

3. The die stacking structure according to claim 1, wherein a carbon content in a lower one of the dielectric layers is greater than a carbon content in another one of the dielectric layers at a higher level.

4. The die stacking structure according to claim 1, wherein the top surface of the topmost one of the dielectric layers is substantially coplanar with top surfaces of the second device dies.

5. The die stacking structure according to claim 1, wherein a bottommost one of the dielectric layers has a bottom surface extending along a top surface of the first device die, and others of the dielectric layers each have a bottom surface concave toward the first device die.

6. The die stacking structure according to claim 1, wherein a thickness of a bottommost one of the dielectric layers gradually decreases from sidewalls of the second device dies, and a thickness of a topmost one of the dielectric layers gradually increases from the sidewalls of the second devices.

7. The die stacking structure according to claim 1, further comprising:
at least one adhesion layer, separating the dielectric layers from the first and second device dies.

8. The die stacking structure according to claim 7, wherein the at least one adhesion layer comprises a first adhesion layer and a second adhesion layer formed of different materials, and the second adhesion layer extends in between the first adhesion layer and the dielectric layers.

9. The die stacking structure according to claim 1, further comprising:
a protection layer, extending along a topmost surface of the dielectric layers and top surfaces of the second device dies.

10. A semiconductor package, comprising:
a die stacking structure, comprising:
a first device die;
second device dies, bonded to the first device die and arranged side-by-side; and
a stack of dielectric layers, extending in between the second device dies, and laterally enclosing each of the second device dies, wherein the dielectric layers are respectively formed of a spin-on-glass (SOG) or a polymer, and one of the dielectric layers has a thickness greater than a thickness of another one of the dielectric layers more distant from the first device die; and
a package component, electrically connected to the die stacking structure from above or below the die stacking structure,
wherein a topmost one of the dielectric layers has a substantially flat top surface, and others of the dielectric layers each have a top surface concave toward the first device die.

11. The semiconductor package according to claim 10, wherein the package component is an interposer comprising through substrate vias for providing vertical conduction paths, and the die stacking structure is bonded to a first side of the interposer.

12. The semiconductor package according to claim 11, wherein the interposer is bonded to a package substrate by a second side facing away from the first side.

13. The semiconductor package according to claim 10, wherein the die stacking structure is laterally encapsulated by an encapsulant, and a redistribution structure is formed along a first side of an encapsulated structure comprising the die stacking structure and the encapsulant.

14. The semiconductor package according to claim 13, further comprising a semiconductor package bonded to a second side of the encapsulated structure facing away from the redistribution structure.

15. The semiconductor package according to claim 14, wherein through encapsulant vias extend through the encapsulant to provide vertical conductive paths in the encapsulant.

16. A method for forming a die stacking structure, comprising:
providing a device wafer;
bonding device dies onto the device wafer;
performing a first solution process using a first spin-on-glass (SOG) or a first polymer, to form a first dielectric layer laterally enclosing each of the device dies;
performing a second solution process using a second SOG or a second polymer, to form a second dielectric layer on the first dielectric layer;
performing a third solution process using a third SOG or a third polymer, to form a third dielectric layer on the second dielectric layer, wherein;
performing a planarization process on the third dielectric layer, such that the third dielectric layer has a substantially flat top surface, whereas the first and second dielectric layers respectively have a top surface concave toward the device wafer; and
performing a singulation process, to cut through the device wafer and the first through third dielectric layers.

17. The method for forming the die stacking structure according to claim 16, wherein the first through third solution processes respectively comprise a spin coating process, an inkjet printing process or a dispensing process.

18. The method for forming the die stacking structure according to claim 16, further comprising:
forming at least one adhesion layer conformally covering the device wafer and the device dies before performing the first solution process.

19. The method for forming the die stacking structure according to claim 16, further comprising:
   forming a protection layer to cover the first through third dielectric layers and the device dies before performing the singulation process.

20. The method for forming the die stacking structure according to claim 16, wherein a viscosity of the second SOG/polymer is greater than a viscosity of the first SOG/polymer, and a viscosity of the third SOG/polymer is greater than the viscosity of the second SOG/polymer.

* * * * *